US 7,260,794 B2

(12) United States Patent
Butts

(10) Patent No.: US 7,260,794 B2
(45) Date of Patent: Aug. 21, 2007

(54) LOGIC MULTIPROCESSOR FOR FPGA IMPLEMENTATION

(75) Inventor: Michael R. Butts, Portland, OR (US)

(73) Assignee: Quickturn Design Systems, Inc., San Jose, CA (US)

( * ) Notice: Subject to any disclaimer, the term of this patent is extended or adjusted under 35 U.S.C. 154(b) by 304 days.

(21) Appl. No.: 10/669,095

(22) Filed: Sep. 23, 2003

(65) Prior Publication Data

US 2004/0123258 A1    Jun. 24, 2004

Related U.S. Application Data

(60) Provisional application No. 60/435,385, filed on Dec. 20, 2002.

(51) Int. Cl.
*G06F 17/50* (2006.01)
(52) U.S. Cl. .................. 716/4; 716/5; 716/6; 716/7; 716/18; 703/13; 703/14; 703/17
(58) Field of Classification Search ............... 716/4–7; 703/13, 17; 713/193; 714/725; 712/1
See application file for complete search history.

(56) References Cited

U.S. PATENT DOCUMENTS

| 4,306,286 A | 12/1981 | Butts et al. |
| 4,656,580 A | 4/1987 | Hitchcock, Sr. et al. |
| 4,914,612 A | 4/1990 | Beece et al. |
| 5,036,473 A | 7/1991 | Butts et al. |
| 5,109,353 A | 4/1992 | Sample et al. |
| 5,475,830 A | 12/1995 | Chen et al. |
| 5,551,013 A | 8/1996 | Beausoleil et al. |
| 5,960,191 A | 9/1999 | Sample et al. |
| 6,035,117 A | 3/2000 | Beausoleil et al. |
| 6,051,030 A | 4/2000 | Beausoleil et al. |
| 6,223,272 B1 * | 4/2001 | Coehlo et al. ................. 712/1 |
| 6,230,303 B1 * | 5/2001 | Dave ............................. 716/7 |
| 6,466,898 B1 * | 10/2002 | Chan ........................... 703/17 |
| 6,567,962 B2 * | 5/2003 | Baumgartner et al. ......... 716/6 |
| 6,654,934 B1 * | 11/2003 | Nemecek et al. ............ 716/4 |
| 6,681,353 B1 * | 1/2004 | Barrow ....................... 714/725 |
| 6,779,170 B1 * | 8/2004 | Montrym ....................... 716/7 |
| 6,832,185 B1 * | 12/2004 | Musselman et al. .......... 703/23 |
| 6,842,879 B1 * | 1/2005 | Jochym et al. ................ 716/1 |
| 6,978,234 B1 * | 12/2005 | Battaline et al. ............. 703/28 |

(Continued)

OTHER PUBLICATIONS

Platzner et al., "A distributed computer architecture for qualitative simulation based on a multi-DSP and FPGAs", Jan. 25-27, 1995, Parallel and Distributed Processing, 1995. Proceedings. Euromicro Workshop on, pp. 311-318.*

*Primary Examiner*—Paul Dinh
*Assistant Examiner*—Helen Rossoshek
(74) *Attorney, Agent, or Firm*—Orrick, Herrington & Sutcliffe LLP

(57) ABSTRACT

A design verification system utilizing programmable logic devices having varying numbers of logic processors, macro processors, memory processors and general purpose processors programmed therein is disclosed. These various processors can execute Boolean functions, macro operations, memory operations, and other computer instructions. This avoids either the need to implement logic or the need to compile the design into many gate-level Boolean logic operations for logic processors. Improved efficiency in the form of lower cost, lower power and/or higher speeds are the result when verifying certain types of designs.

8 Claims, 7 Drawing Sheets

Logic Processor for programming into FPGAs
(All memories and registers are synchronously clocked by the common system clock.)

U.S. PATENT DOCUMENTS

2001/0025363 A1* 9/2001 Ussery et al. .................. 716/1
2002/0133325 A1* 9/2002 Hoare et al. .................. 703/17
2003/0093254 A1* 5/2003 Frankel et al. ................ 703/13
2004/0133794 A1* 7/2004 Kocher et al. .............. 713/193
2006/0229856 A1* 10/2006 Burrus et al. ................. 703/11

* cited by examiner

Logic Processor for programming into FPGAs
(All memories and registers are synchronously clocked by the common system clock.)

MACRO PROCESSOR

LOGIC MULTIPROCESSOR FOR FPGA IMPLEMENTATION

RELATED APPLICATIONS

This application claims the benefit of U.S. Provisional Application Ser. No. 60/435,385, filed on Dec. 20, 2002. The contents of U.S. Provisional Application Ser. No. 60/435,385 are incorporated herein by reference in their entirety.

FIELD OF THE INVENTION

The present invention relates to functional verification of integrated circuit designs, and more particularly, relates to a structure and apparatus for implementing a processor based logic acceleration system or logic emulation system with field programmable gate arrays (FPGAs).

BACKGROUND OF THE INVENTION

Hardware logic emulation systems and acceleration systems are used for functional verification of integrated circuit designs. A logic emulator is typically used with the testing environment provided through an in-circuit connection to other hardware, while an accelerator is typically used with or like a software simulator, with the testing environment provided through software testbenches or test vectors. Often the same core machine is used in either application. Hardware logic emulators and accelerators are known devices that implement a user's design in a plurality of programmable integrated circuits. Such logic emulators and accelerators are available from various vendors, including Cadence Design Systems, Inc., San Jose, Calif., United States of America, and others. Typical systems utilize either programmable logic chips, which are programmably interconnected or a system of special-purpose processor chips.

In programmable logic chip (e.g., field programmable gate array, or FPGA) based systems, the logic contained in the user's design (referred to herein as the "design under verification", or "DUV") is modeled directly in programmable logic form. Examples of hardware logic emulation systems using programmable logic devices can be seen in, e.g., U.S. Pat. Nos. 5,109,353, 5,036,473, 5,475,830 and 5,960,191. U.S. Pat. Nos. 5,109,353, 5,036,473, 5,475,830 and 5,960,191 are incorporated herein by reference. FPGA based emulators and accelerators require FPGA placement and routing, may suffer from timing-induced errors, can present difficult modeling problems for complex memories, and suffer from low performance due to insufficient FPGA package pins.

In processor-based emulation and acceleration systems, the user's design is processed so that its functionality appears to be created in the processors by calculating the outputs of the design. The logic itself is not implemented in a processor-based emulation system, meaning that the DUV does not take actual operating form in the processors. Exemplary processor-based accelerators have been built in large-scale multi-million-gate ASIC-based implementations. These machines are very powerful, but can be too large and expensive for many designs. Further, due to their ASIC implementation of the processor modules, such machines cannot allow macro-level function processors, general-purpose (CPU-based) processors and other specialized functions since the required mix among different types varies widely from design to design. Examples of hardware logic emulation and acceleration systems using processor chips can be seen in, e.g., U.S. Pat. Nos. 4,306,286, 4,656,580, 4,914,612, 5,551,013, 6,035,117, 6,051,030. U.S. Pat. Nos. 4,306,286, 4,656,580, 4,914,612, 5,551,013, 6,035,117, 6,051,030 are incorporated herein by reference.

In processor based acceleration or emulation systems, massively parallel multiprocessors are used for accelerating the simulation of or emulating logic designs. Frequently, these logic designs are expressed at the register-transfer-level and are not limited to gate-level Boolean logic. These designs also include macro operations such as multi-bit addition, multiplication and selection. Accelerated logic simulation is needed since software logic simulation, the most common form of functional verification, is not fast enough to execute software or process large datasets on designs with 500K gates and above. For example, prior event-based gate-level simulation accelerators such as NSim operate at the gate level with full timing simulation, which prevents enough performance to be meaningful.

Thus, there is a need for a design verification system that can flexibly implement various different types of processors depending upon the design being verified.

SUMMARY OF THE INVENTION

In the various embodiments disclosed herein, logic processors, macro processors, memory processors and general purpose processors are programmed into programmable logic devices. These various processors can execute Boolean logic functions, macro operations, memory operations, and other computer instructions. This avoids the need to implement logic, as in prior art FPGA based emulation systems, and also avoids the need to compile the design to be verified into many gate-level Boolean logic operations for logic processors as in the existing processor based acceleration and emulation systems. Improved efficiency in the form of lower cost, lower power and/or higher speed result when verifying certain types of designs. While, for clarity, this disclosure discusses a preferred logic accelerator embodiment, it is understood that just as with prior art processor-based accelerators, the embodiments disclosed herein may be operated in-circuit as a logic emulator as well.

In one aspect of the various embodiments disclosed herein, a design verification system for verifying functionality of electronic designs is taught. The design verification system of this aspect comprises at least one programmable logic device. These programmable logic device(s) comprise a plurality of logic elements that can be placed in electrical communication with one another. The design verification system also comprises at least one logic processor programmed into the programmable logic device(s). The logic processor(s) utilize at least one of the plurality of logic elements of a programmable logic device. The logic processor(s) comprising a logic functional unit that executes Boolean instructions. The design verification system also comprises at least one macro processor programmed into the programmable logic device(s). The macro processor(s) utilize at least one the of logic elements of the programmable logic device(s). The macro processors comprise a macro functional unit that executes macro instructions. The design verification system of this aspect also includes an an interconnect architecture that is programmed into the programmable logic device(s). The interconnect architecture places each of the logic processor(s) and the macro processor(s) in communication with every other of the logic processors and macro processors.

In another aspect of the embodiments disclosed herein, the design verification system comprises memory processor (s) programmed into the programmable logic device. The memory processor(s) comprise a memory functional unit that can store data. The memory processor communicates with the logic processor(s) and the macro processor(s) through the interconnect architecture.

In another aspect of the embodiments disclosed herein, the memory processor comprises an instruction memory and a register file that is controlled by the instruction memory. The register file has outputs selectively in communication the memory functional unit. The register file comprises input registers and local registers. The input registers communicate with the interconnect architecture while the local registers in communicate with output from the memory functional unit.

In another aspect of the embodiments disclosed herein, the design verification system comprises a general purpose processor. The general purpose processor comprises a central processing unit that executes computer instructions. The general purpose processor communicates with the logic processor(s) and the macro processor(s) through the interconnect architecture.

In another aspect of the embodiments disclosed herein, the logic processor comprises an instruction memory and a register file controlled by the instruction memory. The register file has outputs selectively in communication with the logic functional unit. The register file comprises input registers and local registers. The input registers communicate with the interconnect architecture. The local registers communicate with output from the logic functional unit.

In another aspect of the embodiments disclosed herein, the macro processor comprises an instruction memory and a register file controlled by the instruction memory. The register file has outputs selectively in communication the macro functional unit. The register file comprises input registers and local registers. The input registers communicate with the interconnect architecture. The local registers communicate with output from the macro functional unit.

In another aspect of the embodiments disclosed herein, the interconnect architecture comprises an instruction memory. The interconnect also comprises a plurality of buffers wherein the number of buffers is equal to the sum of the number of logic processors added to the number of macro processors added to the number of memory processors. Each of the plurality of buffers has an output that is selected by the instruction memory. In the various embodiments disclosed, the interconnect architecture also comprises a plurality of selectors wherein the number of selectors is equal to the number of buffers. Each of the selectors communicates with each of the buffers so that data stored in any of the plurality of buffers can be transmitted to any of the selectors. Each of the selectors is controlled by the instruction memory. The interconnect architecture also comprises a plurality of output ports. Each of the output ports correspond to one of the selectors.

In another aspect of the various embodiments disclosed herein, a method for implementing a design verification system into at least one programmable logic device so that a user design to be verified can be implemented therein can comprise mapping the user design into operations for execution, partitioning each of the operations into processor types suitable for each of the operations, ordering each of the processor types according to connectivity of each of the processor types, scheduling communications between each of the processor types, and programming each of the at least one programmable logic device with each of the processor types.

In another aspect of the embodiments disclosed herein, processor types comprise logic processors, macro processors, memory processors and general purpose processors.

In another aspect of the embodiments disclosed herein, the memory processor comprises an instruction memory and a memory functional unit that can store data. The memory processor also comprises a register file controlled by the instruction memory. The register file has outputs selectively in communication the memory functional unit. The register file comprises input registers and local registers. The local registers communicate with output from the memory functional unit.

In another aspect of the embodiments disclosed herein the general purpose processors comprise a central processing unit that executes computer instructions.

In another aspect of the embodiments disclosed herein the logic processors comprise an instruction memory, a logic functional unit that executes Boolean logic instructions and a register file controlled by the instruction memory. The register file has outputs selectively in communication with the logic functional unit. The register file comprises input registers and local registers. The local registers communicate with output from the logic functional unit.

In another aspect of the embodiments disclosed herein, the macro processors comprise an instruction memory, a macro processor executes macro instructions and a register file controlled by the instruction memory. The register file has outputs selectively in communication the macro functional unit. The register file comprises input registers and local registers. The local registers communicate with output from the macro functional unit.

In yet another aspect of the embodiments disclosed herein, partitioning step comprises consulting a programmable logic device library that has a preprogrammed mix of processor types and selecting an appropriate preprogrammed mix of processor types for the operations for execution.

In another aspect of the embodiments disclosed herein, the scheduling step comprises creating a program for instruction memories within each of the processor types and creating programming files for each programmable logic device used for verifying the user design.

In another aspect of the embodiments disclosed herein the program is loaded into each of the instruction memories.

In another aspect of the embodiments disclosed herein a method for verifying functionality of an electronic design is disclosed where the electronic design includes Boolean logic gates, at least one macro function and at least one memory circuit. The method comprises compiling the electronic design into logic processors that execute the Boolean logic gates, at least one macro processor that executes the at least one macro function, at least one memory processor that executes the at least one memory circuit, and an interconnect architecture that interconnects the logic processors, the macro processor(s) and the memory processor(s) to one another. In the various aspects disclosed herein, the method also comprises programming the logic processors, the macro processor(s) and the memory processor(s) into at least one programmable logic device. In the various aspects disclosed herein, the methods also comprise applying stimulus to the logic processors programmed into the programmable logic device(s), the macro processor(s) programmed into the programmable logic device(s) and the memory processor(s) programmed into the programmable logic device(s) such that the logic processors execute the Boolean logic gates, the macro processor(s) execute the macro function(s) and the memory processor(s) execute the memory circuit(s). In the various aspects disclosed herein, the method also comprises collecting output responses generated by the logic processors, the macro processor(s) and the memory processor(s).

The above and other preferred features of the invention, including various novel details of implementation and combination of elements will now be more particularly described with reference to the accompanying drawings and pointed out in the claims. It will be understood that the particular methods and circuits embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

Reference is made to the accompanying drawings in which are shown illustrative embodiments of aspects of the invention, from which novel features and advantages will be apparent.

DETAILED DESCRIPTION OF THE DRAWINGS

Figure 1:
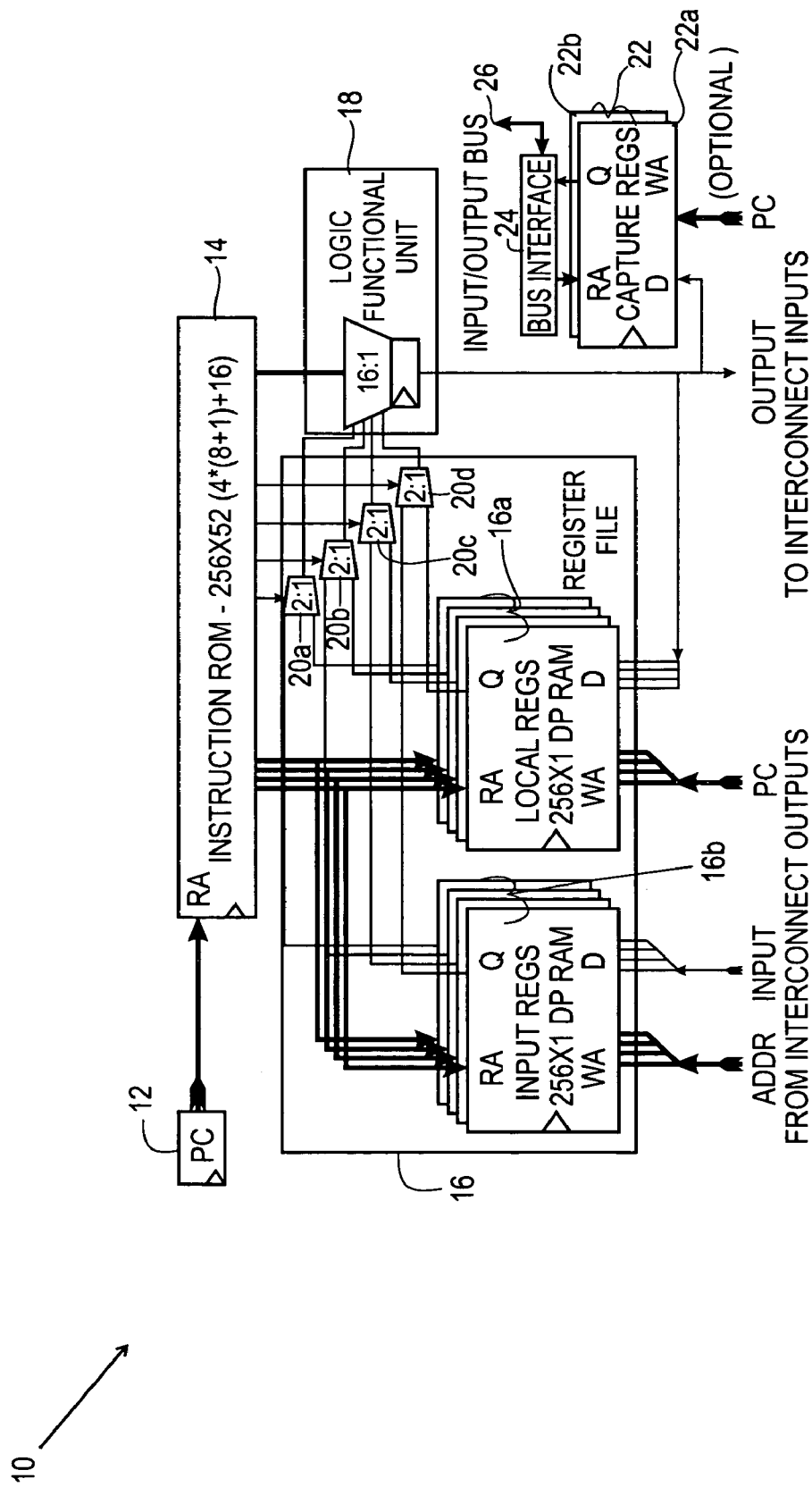
FIG. 1 is a logic diagram of a logic processor that can be programmed into an FPGA.

Turning to the figures, the presently preferred apparatus and methods of the present invention will now be described.

The various embodiments disclosed herein are based on the technology and general architecture of the processor-based emulators sold by Cadence Design Systems, Inc. As is well-known, processor-based emulators are fundamentally different in structure, operation and design than emulators based on field programmable gate arrays ("FPGAs"). The embodiments disclosed herein extend the processor based emulator architecture in ways enabled by FPGA implementation. However, it is important to note that the various embodiments disclosed herein are not an FPGA-based emulator like those available from Cadence (e.g., Quickturn), Mentor Graphics, IKOS, Axis and others. In FPGA-based emulators, each FPGA's programming is compiled differently, at time of use, to emulate each emulated design. The various embodiments disclosed herein are a processor-based accelerator implemented in FPGAs rather than dedicated ASIC processors, like the previously available processor based accelerators. In the embodiments described herein, each FPGA's programming is pre-compiled, to implement all or part of the processor based accelerator's standard functions.

Designs to be accelerated are normally written in register transfer logic ("RTL") form (e.g., Verilog or VHDL) containing macro-level functions like "add", "increment", "multiply", "multiplex" etc. These can be accelerated in macro-level function form much more economically and faster than reducing each macro function to many gate-level logic primitives, as is typically done in prior art processor based design verification. Electronic designs, however, have a widely varying proportion of macros to gate-level logic. An accelerator implemented in ASIC processor form as in prior art processor-based emulators must have a fixed allocation of resources, making macro-level acceleration problematic, since there would usually be too many macro-level processors, wasting capacity, or too few, wasting acceleration opportunity.

Since the various embodiments disclosed herein are implemented in FPGAs, many different forms of the accelerator are pre-designed and pre-compiled into a library of FPGA programs. This library makes it possible to have more than one accelerator available, each one with a different proportion allocated to macro-level versus gate-level logic function processors. At run time, the form of accelerator which best suits the mix of macros and logic in the design to be accelerated may be selected and the precompiled FPGA programs for this form are programmed into each of its FPGAs. Because the EPGA programs are precompiled, no FPGA compilation at run time is required. This principle is also extended to other specialized processors, such as memory processors and general-purpose processors.

A design verification system using the concepts disclosed herein can have a number of logic processors, macro processors, memory processors, general purpose processors and/or interface units programmed into the FPGAs comprising the accelerator. These various types of processors communicate through an interconnect. Each processor that can be programmed into the FPGAs can have a wide, shallow instruction memory. A global program counter (sometimes referred to as "PC") makes them act as a single ultra-wide instruction word processor. An input/output bus 524 (see FIG. 6) connects interface units 500 and capture registers in the processors to software running on a host computer (not shown).

A netlist of combinational logic, macro functions, memories, and registers, where all registers have a common clock, can be compiled into instructions for the processors programmed into the FPGAs, such that a single pass through the program executes one clock cycle in the netlist. Each such single pass through the program is called a major cycle. See, e.g., U.S. Pat. Nos. 4,306,286, 4,656,580, 4,914,612, 5,551, 013, 6,035,117, 6,051,030. Note that the compiler software maps any synthesizable logic design, including multiple asynchronous clock domains, gated clocks, latches and asynchronous feedback loops, onto such a netlist.

The embodiments disclosed herein are ideal for implementation with memory-intensive FPGAs like the Virtex-II family of FPGAs available from Xilinx, Inc., San Jose, Calif., USA. The concepts disclosed herein can be implemented with FPGAs providing wide memories for instruction storage and small dual-ported register files for temporary data storage. Virtex-II FPGAs include a number of dual-ported RAM blocks, which Xilinx calls BlockRAMs. Presently available Virtex-II FPGAs have 18-kilobit Block-RAMs. Each of these BlockRAM structures may be configured for data as wide as thirty-six (36) bits. When both ports are ganged together, a 72-bit-wide single-ported RAM is made available. Currently available Virtex-II FPGAs also allow any logic block lookup table to be configured as a small sixteen (16) bit dual-ported RAM register file. Since each stage is pipelined and globally synchronous, and the FPGAs used are preferably compiled once at the factory, never in the field, this accelerator's system clock can run at 125 to 200 MHz. In addition, Virtex-II Pro FPGAs include up to four 300 MHz PowerPC CPUs, which can act as general purpose processors, running C functions, SystemC and behavioral HDL, very tightly coupled with other processors through the interconnect. Of course other FPGAs besides the Xilinx Virtex-II may be used to implement these embodiments.

Turning now to FIG. 1, a preferable logic processor 10 will now be described. Each logic processor 10 that can be programmed into the FPGAs has a program counter ("PC") 12, instruction memory 14, a register file 16 and a logic functional unit 18, and connections with the interconnect 100 (described below). These connections with the interconnect 100 place the logic processor 10 in communication with interconnect inputs and interconnect outputs of other processors in the accelerator system.

The register file 16 has a region for storing functional unit outputs, referred to as Local Registers 16a. As is seen in FIG. 1, the output of functional unit 18 is sent to the interconnect 100 and also to the local registers 16a. Register file 16 also comprises a region for storing inputs from the interconnect, referred to as input registers 16b. Local registers 16a and input registers 16b preferably have the same number of entries (for example, two hundred fifty six (256) in the example shown in FIG. 1) as the instruction memory 14, although the word length may differ. This ensures that every result from the functional unit 18 for each instruction and every input from the interconnect 100 has its own location in the register file 16. Local registers 16a and input registers 16b preferably have four sets of dual-ported lookup table RAMs that will provide four read ports and one write port. Local registers 16a and input registers 16b are preferably dual ported to allow data from the interconnect and from functional unit outputs to be written in the same instruction cycle as inputs to the functional unit are read.

Instruction memory 14 stores a set of instructions, and presents the one addressed by the program counter ("PC") 12 the output of the instruction memory 14. Each instruction has a set of instruction fields that control the functions of the elements in the logic processor. In the embodiment shown in FIG. 1, each instruction preferably has these fields: a) four 9-bit address fields, one for each read port of both local registers 16a and input registers 16b in common, b) four 1-bit selects controlling multiplexers 20a, 20b, 20c and 20d, which choose either the local register 16a read port or the input register 16b read port for each logic functional unit 18 input, and c) a 16-bit field which specifies the logic function to be executed by the logic functional unit 18.

As shown in FIG. 1, the instruction memory 14 has two hundred and fifty six (256) instructions. The reason this is presently so is that the widest, shortest form of Virtex-II BlockRAMs currently available is 256 words by 72 bits. Each Virtex-II FPGA presently available from Xilinx has 512 word by 36 bit BlockRAMs with two ports A and B. When used in instruction memory 14, each BlockRAM is used as 256 words by 72 bits with one port: port A's address lsb=0, port B's address lsb=1, port A and port B 36-bit data in and out are concatenated to 72 bits, and all other address bits, clock and write enable inputs are tied together in common. The host workstation writes instructions into instruction memory 14 only when processors are stopped (through a write data path not shown). Correspondingly the input register 16b and local register 16a are each two hundred fifty-six (256) words by one (1) bit. Together they require the use of two hundred fifty six (256) logic elements in the presently available Virtex-II FPGA. Note that as FPGA technology advances, these specifications may improve. Thus, this discussion should not be construed as being limiting in any fashion. During operation instruction memory 14 is addressed by the program counter PC 12. Of course, the number of instructions can increase or decrease depending upon the FPGA used.

Logic functional unit 18 is a multiplexer with a registered output that executes a logic function. Four 1-bit data inputs from local registers 16a and/or input registers, selected by multiplexers 20a, 20b, 20c and 20d, drive the four select inputs of the logic functional unit 18 multiplexer. These select inputs choose one of sixteen (16) bits in the truth table field of the current instruction to be registered on the logic functional unit 18 output. Thus, the sixteen (16) bit truth table instruction field from instruction memory 14 selected with the logic functional unit 18 multiplexer acts as a lookup table, implementing any four input logic function of the data inputs.

An instruction operation will now be described. Each cycle of the accelerator system clock (i.e., the clock driving the accelerator, not the clock from the DUV) executes one instruction, which then advances the program counter PC 12. The program counter PC 12 starts from zero at the beginning of each major cycle. For each instruction, the interconnect writes an input into one of the input registers 16b. The interconnect carries addresses for each input so that the input data can be stored at a specific location within the input register file 16b. Each instruction can perform a four (4) input logic function on the input registers 16a and/or local registers 16b. As shown in FIG. 1, registers 16, instruction memory 10, and logic functional unit 18 are preferably all synchronously clocked by the system clock (not shown). This pipelining spreads the operation of each instruction across several system clock cycles, in pipelined fashion, which is a well-known processor design technique to improve performance. All other resources of this accelerator system described below are preferably pipelined in this fashion.

The instruction memory 14 controls which data is input to the functional unit 18 because the instruction memory 14 has outputs driving multiplexers 20a, 20b, 20c and 20d. Multiplexers 20a, 20b, 20c and 20d have first inputs receiving outputs from one of the dual-ported lookup table RAMs comprising input registers 16b. Multiplexers 20a, 20b, 20c and 20d have second inputs receiving outputs from one of the dual-ported lookup table RAMs comprising local registers 16a. The outputs of multiplexers 20a, 20b, 20c and 20d are input to logic functional unit 18. The bits output from multiplexers 20a, 20b, 20c and 20d select one of sixteen bits from the truth table instruction field. Because the functional unit 18 stores its result in the local register 16a in addition to placing the result on the interconnect, the result of a logic function is available for input into the next logic function or any other logic function which executes afterwards in the major cycle. Because the result is placed onto the interconnect, it is also available to other processors on the same FPGA or elsewhere in the accelerator system.

Presently Preferred Logic Processor Instruction Fields (256 Instruction Form):
Register Input A: 0 to 511 (9 bits)
Register Input B: 0 to 511 (9 bits)
Register Input C: 0 to 511 (9 bits)
Register Input D: 0 to 511 (9 bits)
Truth Table: 16 bits With two hundred and fifty six (256) instructions, each capable of one four-input logic operation and one register bit, which is typically equivalent to eight gates in ASIC form, logic processor 10 can typically process up to 2K (256*8=2048) equivalent ASIC gates. Rent's Rule is a well-known empirical rule for estimating the number of interconnects signals needed to satisfy the input/output connections of a given number of logic functions. Rent's Rule was first published in a paper by B. S. Landman and R. L. Russo, "On a pin versus block relationship for partitions of logic graphs," IEEE Transactions on Computing, vol. C-20, pp. 1469-1479, 1971. A very generous set of Rent's Rule coefficients (pins=3 * gates$^{0.6}$) indicates the need for two hundred and ninety one (291) signals for 2K gates. In this logic processor, each instruction can receive the value of one input signal and send the value of one output signal. Thus, this logic processor can support up to five hundred twelve (512) signals, two hundred and fifty six (256) input signals and two hundred and fifty six (256) output signals, in its major cycle. Instruction and communication scheduling constraints may or may not find this sufficient. More input signals could be added by accepting two inputs per instruction and doubling the Input Registers.

All processors running in the same major cycle clock domain share a common program counter (PC 12) addressing their instruction memories. The value of the program counter PC 12 is incremented through the instruction memory addresses containing instructions to be executed, from start to finish once for each major cycle. If interconnected processors are programmed into more than one group for multiple major cycle clock domains, e.g., groups of processors driven by different program counters PC, a program counter PC is provided for each group, and the instruction memory is split up accordingly.

Logic processor 10 can loop sequentially through its instruction memory once per major cycle. Because of the programmable nature of FPGAs, logic processor 10 can modified to be fully generalized if desired by adding an instruction field for writing logic unit output to any local register 16a, not just the one addressed by the PC 12, and/or adding an instruction field for conditional branch off of the output of the functional logic unit 18.

An important feature of any functional verification system is the ability to debug the DUV. In order to fully debug a DUV, users of emulators, accelerators and simulators need to be able to view the results of each logic operation so that they can determine if their design is functioning as they desire. In other words, users of functional verification systems would like to view the state of any signal in their design at any time. To allow for this feature, capture registers 22 (see FIG. 1) may optionally be added to give full visibility into the operation of the DUV to the user of the accelerator. Two copies of a two hundred fifty six by one (256 words by 1 bit) single-ported RAM 22a and 22b are operated as a double buffer, switching between read and write on each major cycle (so they only need one read/write port). On one major cycle, one buffer (e.g., buffer 22a) captures every functional unit 18 result. During the next major cycle, first buffer 22a is stable and may be read out directly or indirectly by a host computer through the input/output bus 26 through a bus interface 24. While first buffer 22a is reading out its contents, second buffer 22a can capture the next functional unit 18 result. Alternatively, the output of functional unit 18 can be stored in a large trace buffer memory (not shown). Other processors may have capture registers like this as well.

Figure 2:
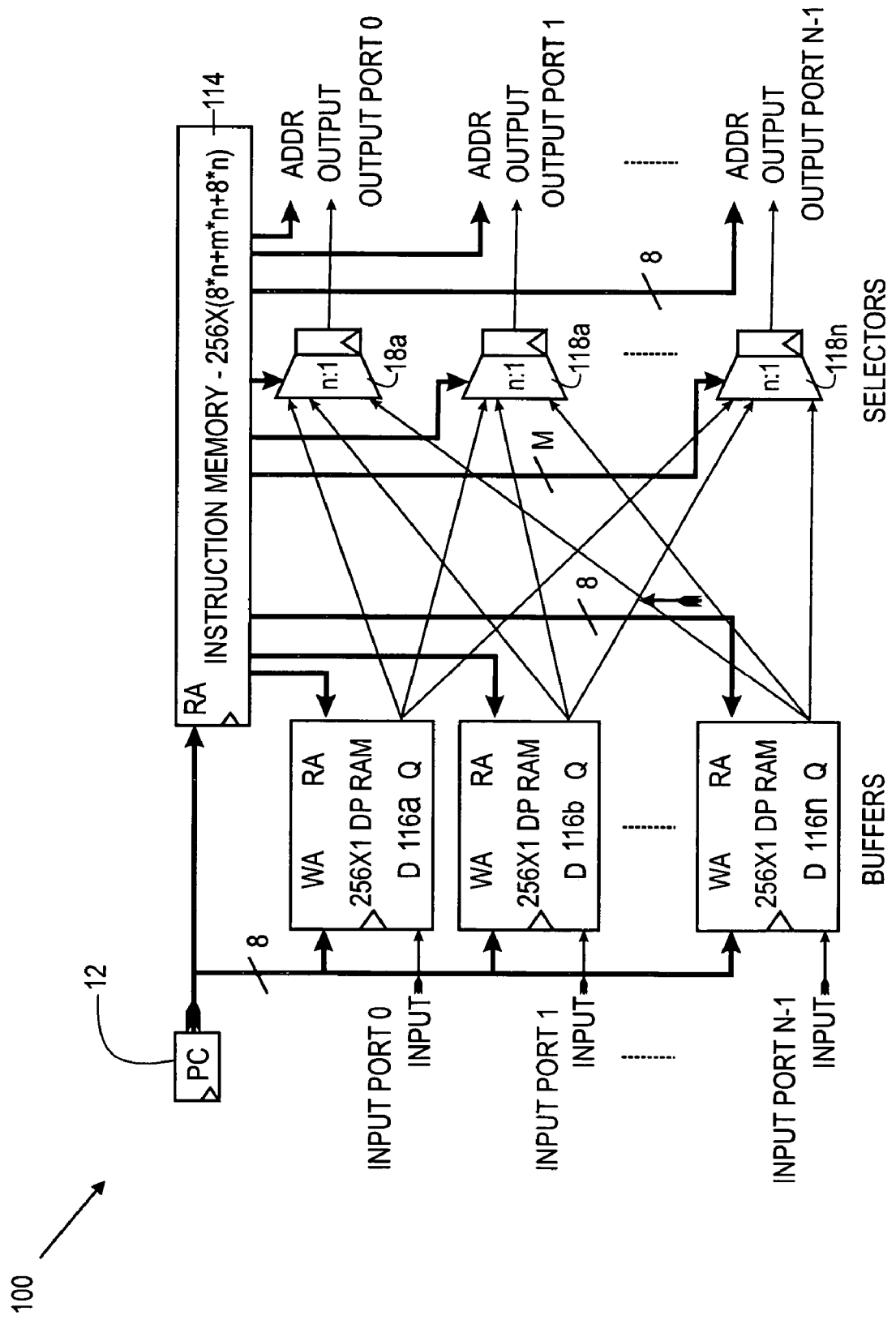
FIG. 2 is a logic diagram of an embodiment of an interconnect architecture that interconnects logic processors and other processors programmed into FPGAs to each other.

Logic processors 10 like that shown in FIG. 1 communicate to other resources, such as processors and interfaces, either on the same FPGA or on other FPGAs through an interconnect. For an interconnect to be rich enough for this application, interconnect must accept one or more output bits from each resource programmed into the FPGA, e.g., logic processor 10, and send one or more input bits to each of the other resources programmed into the same FPGA, e.g., another logic processor 10, during each accelerator system clock. Many forms of interconnect can satisfy this requirement. The presently preferred interconnect 100 is shown in FIG. 2. Interconnect 100 uses program counter PC 12 and has an instruction memory 114. Interconnect 100 also comprises a plurality of buffers 116a, 116b, . . . 116n. Buffers 116a, 116b, . . . 116n can comprise dual-ported RAMs 116a, 116b, . . . 116n. There is preferably one buffer 116a, 116b, . . . 116n for each output bit from each resource programmed into the FPGA, e.g., logic processor 10, and the same number of selectors 118a, 118b, . . . 118n. Selectors 118a, 118b, . . . 118n have the same number of inputs as there are buffers 116a, 116b, . . . 116n. Each selector 118a, 118b, . . . 118n is in communication with every buffer 116a, 116b, . . . 116n.

Interconnect 100 routes data from the accelerator's resource outputs to its resource inputs. Its buffers 116a, 116b, . . . 116n permit slack, i.e. delay, between sending and receiving, so a receiving resource may accept data on any system clock cycle after the sending resource makes it available, which allows flexibility in scheduling the resources' instructions. The manner in which interconnect 100 functions is as follows. On every system clock cycle, each output of each resource programmed into the FPGA, e.g., logic processor 10, is stored in a location in the buffer 116a, 116b, . . . 116n associated with that resource. At the same time (i.e., also on every system clock cycle), any input on each resource programmed into the FPGA, e.g., logic processor 10, can read from any location of any buffer 116a, 116b, . . . 116n through selectors 118a, 118b, . . . 118n.

Instruction memory 114, which is addressed by program counter PC 12, controls the manner in which data is transferred into and out of the buffers 116a, 116b, . . . 116n and into the selectors 118a, 118b, . . . 118n. As is shown in FIG. 2, instruction memory 114 has output fields that are input to each buffer 116a, 116b, . . . 116n, which provides addressing to each. This addressing controls which addresses should be output to the selectors 118a, 118b, . . . 118n. The PC 12 controls which address within buffer 116a, 116b, . . . 116n should store data input thereto. At the same time, additional instruction memory 114 fields control which input on selectors 118a, 118b, . . . 118n (i.e., the output from which particular buffer 116a, 116b, . . . 116n) will be output therefrom. These fields are each m bits wide, where m equals the log base 2 of the number of output ports n, rounded up to the next largest integer.

Interconnect architecture 100 has a number of input ports and a number of output ports. Preferably there will be n input ports and n output ports, where n is equal to the number of input bits and output bits of resources programmed into the FPGA (e.g., logic processors 10). Each input port 0, 1, . . . n comprises an input signal from one of the resources programmed into the FPGAs such as a logic processor, and has an address field from the instruction memory 114. Likewise, each output port 0, 1, . . . n comprises an output signal from selectors 118a, 118b, . . . 118n and has an address field provided by instruction memory 114. These signals are in electrical communication with a corresponding one of the input registers 16b in logic processor 10 (or input structures on another resource programmed into the FPGA, such as the macro processor described below).

A problem in interconnecting accelerator resources is scheduling data transfer at times that are available to both sending and receiving resources. Providing slack through the use of buffers at both ends solves this problem. These buffers allow the transfer to occur at any time after the data is available from the sender and before the receiver needs it. The buffer 116a, 116b, . . . 116n and the input registers 16b in each logic processor 10 provide slack in scheduling interprocessor communications. As soon as the output on a sending processor 10 is available for communication, the data output therefrom is stored in a buffer 116a, 116b, . . . 116n in the interconnect 100. When the selector 118 for the receiving processor 10 is available this data can be read out of the buffer 116a, 116b, . . . 116n and stored in the input registers 16b of the receiving processor 10.

Interconnect input ports 0, 1 . . . n and output ports 0, 1 . . . n of interconnect 100 may also be connected to FPGA external input/output pins to allow interconnection of resources in one FPGA with resources in other FPGAs. In particular, one or more of interconnect input ports 0, 1 . . . n of an instance of interconnect 100 in one FPGA may communicate to one or more of output ports 0, 1 . . . n in one or more instances of interconnect 100 in one or more other FPGAs, and vice versa, to allow data to flow between resources programmed into different FPGAs. In such an arrangement, the externally connected interconnect input ports 0, 1 . . . n and output ports 0, 1 . . . n may be connected either directly or through additional higher-level interconnect. This would be useful in larger multi-FPGA acceleration systems.

Because of the programmable nature of FPGAs, resources other than logic processors 10 can be programmed therein. One such resource that would be useful in an acceleration system is a macro processor 200 like that shown in FIG. 3. A macro processor 200 is similar to a logic processor. However, instead of solving single-bit Boolean equations, a macro processor 200 directly executes multi-bit combinational macro functions, examples of which are "add", "multiply", and "multiplex". Note that this list of macro functions is not exhaustive. One having ordinary skill in the art would recognize many other macro functions that can be evaluated using a macro processor 200.

Using macro processors 200 can lead to more efficient and faster acceleration than through the use of logic processors 10. The reason for this is that breaking down such macro functions into gate-level functions is time consuming, uses up logic processor 10 resources that could be used for non-macro functions, and could require solving multiple Boolean equations just to calculate the result of one macro. Since each Boolean equation is solved during one cycle of the program counter PC 12, it could take several such cycles to calculate the result of one macro function, which results in reduced capacity and slower acceleration. For example, a thirty two (32) bit adder can be executed by a one (1) thirty two (32) bit macro processor instruction or four (4) eight (8) bit macro processor instructions. In contrast, calculating the same result using a logic processor 10 would require thirty two (32) logic processor instructions. Since instruction space is a capacity-limiting resource, macro processors could greatly improve capacity.

Figure 3:
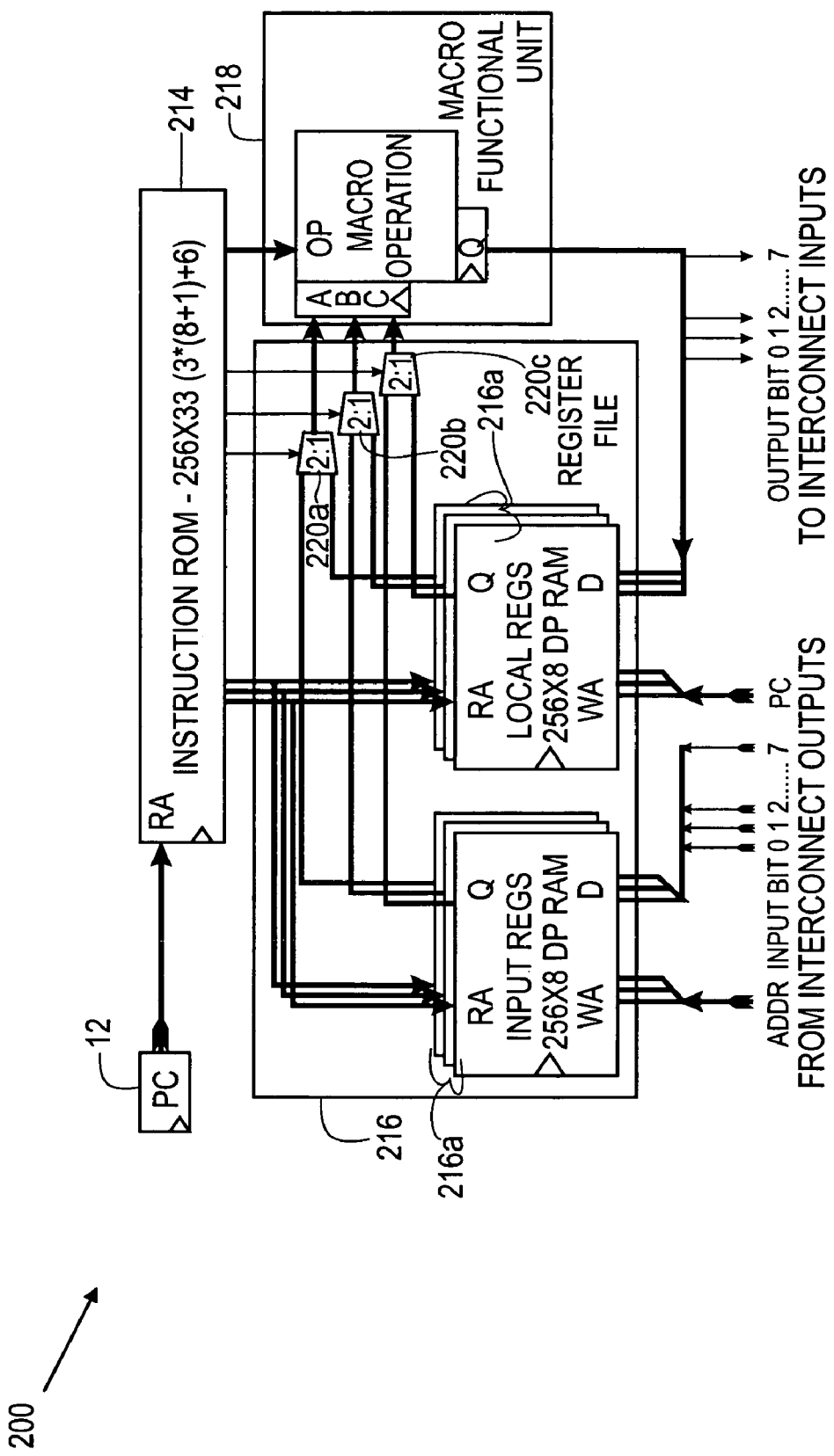
FIG. 3 is a logic diagram of a macro processor that can be programmed into an FPGA.

Turning to FIG. 3, a preferred macro processor 200 will be described. Each macro processor 200 that can be programmed into the FPGAs uses program counter PC 12, and has an instruction memory 214, a register file 216 and a macro functional unit 218. Macro processor 200 also has connections with the interconnect (described below). These connections with the interconnect place the macro processor 200 in communication with interconnect inputs and interconnect outputs.

The register file 216 has a region for storing the outputs of macro functional unit 218, referred to as local registers 216a. As is seen in FIG. 3, the output of macro functional unit 218 is sent to the interconnect and also to the registers 216a. The output of macro functional unit 218 can comprise a word having multiple bits, e.g., eight bits. Register file 216 also comprises a region for storing inputs from the interconnect 100, referred to as input registers 216b. Local registers 216a and input registers 216b preferably have the same number of entries (i.e., 256) as the instruction memory 214. This ensures that every result from the macro functional unit 218 for each instruction and every input from the interconnect 100 has its own location in the register file 216. Local registers 216a and input registers 216b preferably have three sets of dual-ported lookup table RAMs that will provide three read ports and one write port. Local registers 216a and input registers 216b are dual ported to allow data from the interconnect 100 and from the output of macro functional unit 218 to be written in the same instruction cycle as inputs to the macro functional unit 218 are read.

Input register 216b preferably has one-bit connections in and out of the interconnect that serially streams input bits from interconnect 100 into the dual-ported lookup table RAMs. It has as many one-bit connections as the number of bits in the multi-bit data width of macro processor 200. In FIG. 3 this data width is eight bits, shown as input bits 0, 1, 2, . . . 7, rendered in narrow lines signifying one-bit width, busing together into the single eight-bit input register 216b input, rendered as a thicker line signifying a multi-bit bus. Local registers 216a preferably has multi-bit connections with the macro functional unit. Entire data paths are compiled into a single macro processor, only going to bit-wide form for non-macro interconnections.

The instruction memory 214 controls which data is input to the macro functional unit 218 because the instruction memory 214 has output fields addressing local registers 216a and input registers 216b both in common, and controlling multiplexers 220a, 220b and 220c to select between the two. Multiplexers 220a, 220b and 220c have first inputs receiving outputs from one of the dual-ported lookup table RAMs comprising input registers 216b. Multiplexers 220a, 220b and 220c have second inputs receiving outputs from one of the dual-ported lookup table RAMs comprising local registers 216a. The outputs of multiplexers 220a, 220b and 220c are input to macro functional unit 218. The manner of operation of the macro instruction unit 218 is discussed below. Because output of macro functional unit 218 is stored in the local register 216a in addition to being placed on the interconnect, the result of a macro function calculation is available for input into a subsequent macro instruction. In addition, because the result is placed onto the interconnect, it is also available to other resources on the FPGA or elsewhere in the accelerator.

An instruction operation will now be described. Each cycle of the accelerator system clock executes one instruction, which then advances the program counter PC 12. The program counter PC 12 starts from zero at the beginning of each major cycle. In each instruction, three operands are read from any of the local registers 216a and/or input registers 216b, one of 64 possible macro operations is performed by macro functional unit 218, and the result is stored in local registers 216a and made available on outputs to the interconnect. Macro functional unit 218's multi-bit bussed output is split into multiple one-bit outputs for the interconnect. Macro functional unit 218 can perform multi-bit macro operations, such as addition, subtraction, multiplication, bit shifting or rotation, bit field masking and/or merging, multiplexing (one of two inputs is selected by the value of the third input), multi-bit Boolean logic functions, or any other such operation as is well known in processor design. The choice of 64 operations and three inputs is arbitrary, fewer or more operations or fewer or more inputs may be implemented according to the needs of designs to be accelerated. Operations that are defined as primitives in hardware description languages such as Verilog and VHDL are preferred for accelerating designs expressed in those languages.

Preferred Macro Processor Instruction Fields (256 Instruction Form):
Register Input A: 0 to 511 (9 bits)
Register Input B: 0 to 511 (9 bits)
Register Input C: 0 to 511 (9 bits)
Opcode: one of 64 macro operations (6 bits)

Figure 4:
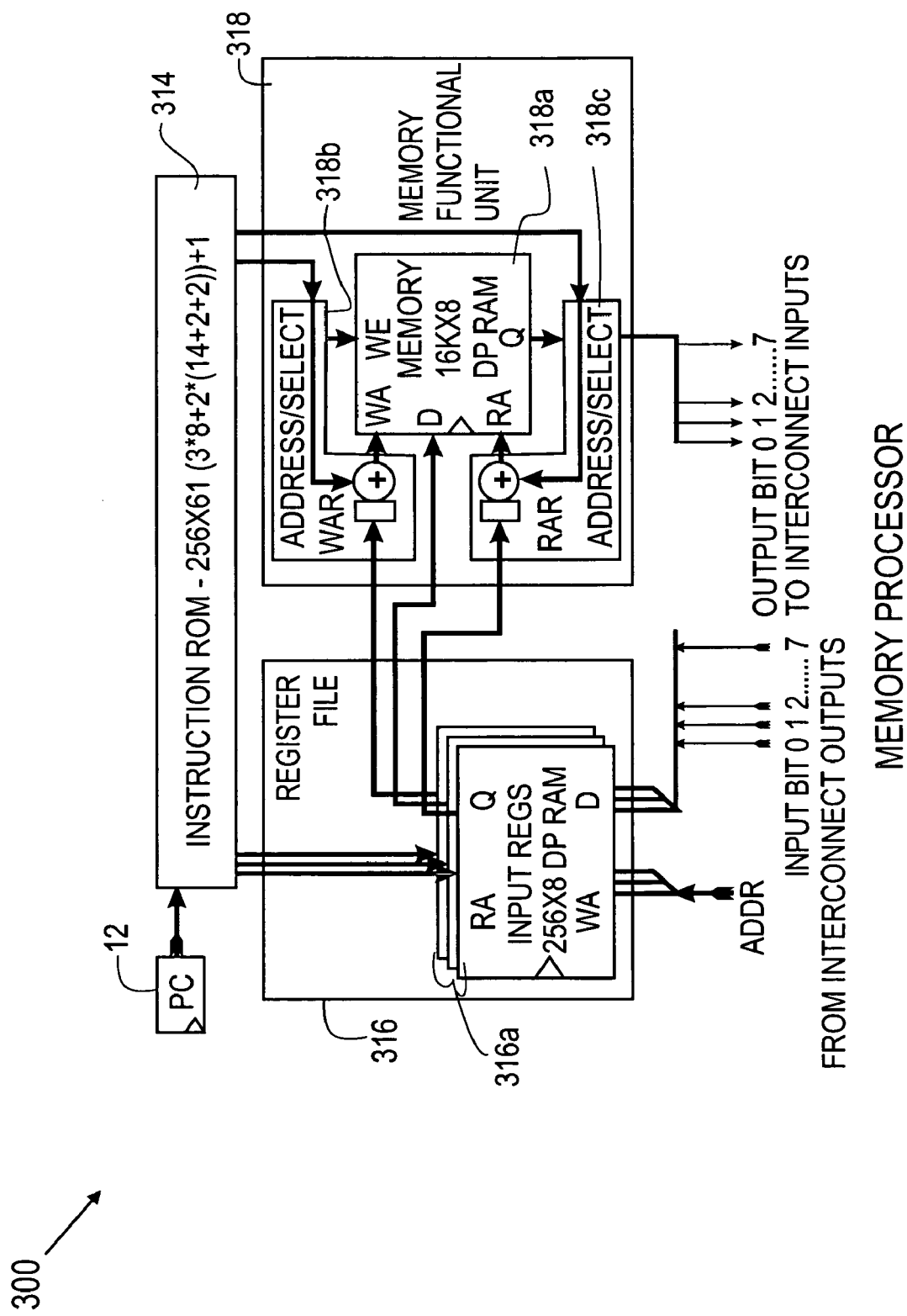
FIG. 4 is a logic diagram of a memory processor that can be programmed into an FPGA.

In addition to logic processors 10 and macro processors 200, memory processors 300 can be programmed into the FPGAs. A presently preferred memory processor 300 is shown in FIG. 4 and will now be described. Memory processor 300 has a memory functional unit 318 with a memory array 318a that allow the storage of data. For example, medium-sized on-chip memories like the Block-RAMs found in the Virtex-II FPGAs from Xilinx can be used for the memory array 318a. In an alternative embodiment, larger off-chip synchronous SRAMs or DRAMs can be used for the memory array 318.

Memory functional unit 318 also comprises a write address/select unit 318b and a read address/select unit 318c. Write address/select unit 318b receives address inputs from a register file 316 (discussed below) and select inputs from an instruction memory 314 (also discussed below). Instruction memory 314 contains instructions stored therein that when input to the write address/select unit 318a and read address/select unit 318b can effectively divide the memory array 318a into multiple memories to implement the memories in the DUV.

As seen in FIG. 4, memory processor 300 has a register file 316 for storing input signals from the interconnect 100. Input registers 316a preferably have the same number of entries (e.g., 256) as the instruction memory 314. Input registers 316a preferably have three sets of dual-ported lookup table RAMs that will provide three read ports and one write port.

Memory processor 300 has multiple one-bit connections into and out of the interconnect, since its datapaths are multi-bit as in the macro processor 200. These connections carry input bits from interconnect 100 into the input registers 316a and carry outputs from the memory functional unit 318 into the interconnect 100. Internally (e.g., from the input registers 316a to the memory functional unit 318), memory processor 300 has multi-bit data paths. The input registers 316 and the memory array 318a preferably have the same data path width. As discussed, input registers 316 receive data from interconnect 100, which acts as a buffer, and provide write addresses to the write address/select unit 318b, write data to the memory array 318a, and read addresses to the read address/select unit 318c of memory functional unit 318.

Instruction memory 314 have similar composition and function as the instruction memories of other processors. The program counter PC 12 drives instruction memory 314. An output field from the instruction memory 314 provides read address signals, which address input registers 316a of the register file 316. Another output field from the instruction memory 314 provides select signals to the write address/select unit 318a and read address/select unit 318c. By providing such instructions, instruction memory 314 can cause data from an input register to be written into one memory location. Likewise, instruction memory 314 can cause data to read from another memory location and place it onto the interconnect 100. Multiport memories are implemented by successive instructions reading or writing the same array address space.

Many memories in a DUV can be mapped into different parts of the address space of the memory array 318a. The select units 318a and 318c make it possible for multiple DUV memories, including those with narrower or wider data width than that of memory array 318a, to be efficiently stored in the memory array 318a. Addresses for memory array 318a are formed in each write address/select unit 318a and read address/select unit 318c by adding a base value from the instruction field provided by instruction memory 314 to an offset from an address register, which is loaded from one or more input registers 316a. The base sets the origin in the memory array 318a of a region for a memory in the DUV, while the offset is the address input to that memory in the DUV. The address registers may be wider than the data path width when the size of the memory array 318a demands.

The presently preferred memory processor 300 shown in FIG. 4 has the following details. The memory functional unit 318 has a 16K word by eight (8)-bit dual-ported memory array, with a port each for reads and writes. The write port has a write address/select unit 318a and the read port has a read address/select unit 318c. The output of the memory functional unit 318 preferably feeds the interconnect 100 directly. Local registers are not needed since memory operations usually do not generally have intermediate results to store. The register file 316 presently comprises a plurality of two hundred fifty six (256) eight (8) bit input registers 316a, with a write port from the interconnect 100 and three read ports for memory write addresses, write data and read addresses. Of course, these specifications are subject to change based upon system requirements and technological advancements in memory capacities, etc.

Most memory data paths in the DUV are as wide or wider than memory array 318a in the memory processor 300. However, in some cases the data paths may not be as wide. Each address/select unit 318a, 318c has logic to map writes and reads into subsets of the full width. For read operations, the memory read address offset from its read address register (RAR) may be split. Low-order bits of the RAR select a field from the memory word, and the rest are right-justified and added to the memory read base address from an instruction field. The selected data is shifted into the least-significant position among the memory processor's outputs to the interconnect, according to an instruction field that preferably selects among these address/offset/select choices:

|   | Offset to RA adder | Select from data |
|---|---|---|
| 1. | RAR bits 13:0 | always data bits 7:0 |
| 2. | RAR bits 13:1 | RAR bit 0 selects data bits 7:4 or 3:0 |
| 3. | RAR bits 13:2 | RAR bits 1:0 select data bits 7:6, 5:4, 3:2, or 1:0 |
| 4. | RAR bits 13:3 | RAR bits 2:0 select data bit 7, 6, 5, 4, 3, 2, 1 or 0. |

For write operations it can be assumed that data narrower than the data path width of memory processor 300 is at the least significant end of the input register word. Thus, for write operations, the write address register (WAR) of the memory functional unit 318 must direct the narrow data from the least significant end into the correct position in the memory word, and enable the write to only those bits.

|   | Offset to WA adder | Shift and enable write of data |
|---|---|---|
| 1. | WAR bits 13:0 | always data bits 7:0 |
| 2. | WAR bits 13:1 | WAR bit 0 directs data write into bits 7:4 or 3:0 |
| 3. | WAR bits 13:2 | WAR bits 1:0 direct data write into bits 7:6, 5:4, 3:2, or 1:0 |
| 4. | WAR bits 13:3 | WAR bits 2:0 direct data write into bit 7, 6, 5, 4, 3, 2, 1 or 0. |

The high and low half of each address register (RAR, WAR) may be loaded from its eight (8) bit input register port, controlled by a 2-bit instruction field.

Instruction Fields:
Input Register Read Ports: 3*8 bits
Read Address/Select Unit:
Address offset: 14 bits,
Address/Offset/Select: 2 bits,
RAR load: 2 bits
Write Address/Select Unit:
Address offset: 14 bits,
Address/Offset/Select: 2 bits,
WAR load: 2 bits
Memory Write Enable: 1 bit.

Figure 5:
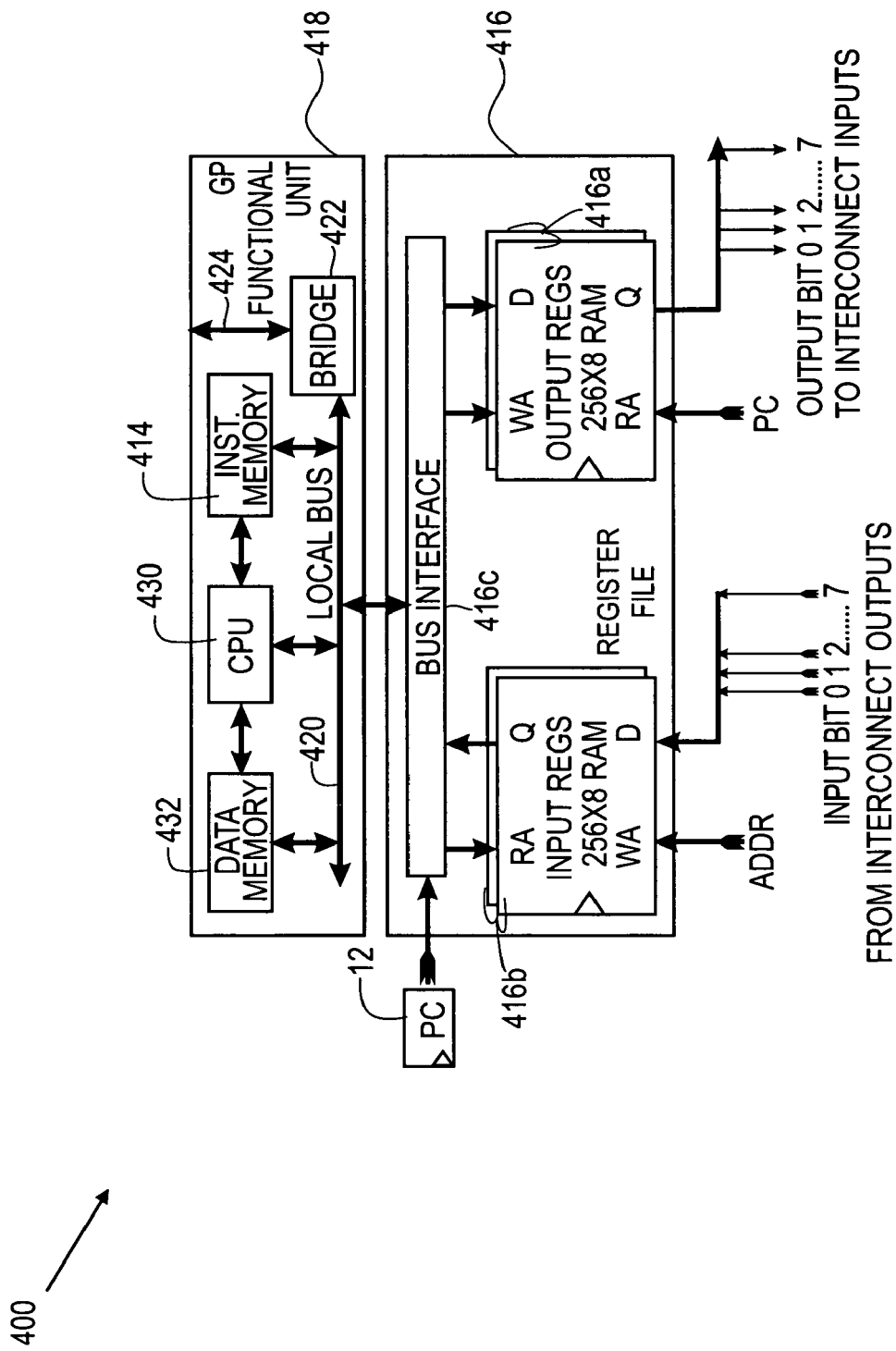
FIG. 5 is a logic diagram of a general purpose processor that can be programmed into an FPGA.

Another processor that can be implemented in the FPGAs used in this type of design verification system is a general purpose processor. A general purpose processor 400 like that shown in FIG. 5 has a functional unit 418 comprised of several subcomponents, including a data memory 432, a central processing unit (CPU) 430 and an instruction memory 414. Together, these structures execute software such as C programs, SystemC and behavioral HDL. Data memory 432, CPU 430 and instruction memory 414 communicate with each other through a local bus 420. Local bus 420 is in communication with a bus interface 416*c* in the register file 416. The CPU 430 and instruction memory 414 may communicate with the host computer (not shown) through a bridge 422 to the input/output bus 424. Bridge 422 sends and receives data over the local bus 420. In certain applications, the CPU 430 may run a complete real-time operating system, or only a thin set of library functions, as appropriate to its use, and would communicate with the host computer for file access, etc. In other applications, the CPU 430 can execute a small self-contained logic function written in behavioral software form.

General purpose processor 400 exchanges data with the rest of the apparatus through a register file 416 comprised of output register file 416*a*, input register file 416*b* and bus interface 416*c*, although bus interface 416*c*, as discussed is used for transferring data between the register file 416 and the general purpose functional unit 418 within the general purpose processor 400. The program counter PC 12 preferably drives bus interface 416*c*. Output register file 416*a* and input register file 416*b* are in communication, through interconnect 100, with the other processors implemented in the FPGAs in the system. Output register file 416*a* and input register file 416*b* preferably comprise one or more dual-ported RAMs as in macro processor register files 216. The outputs of the interconnect 100 supply an address input and data to the input register file 416*b*. Likewise, the output register file 416*a*, which is driven by the program counter PC 12, supplies data to the interconnect 100. In both cases, the bussed multi-bit data in this processor is broken into multiple one-bit data connections for connection to interconnect 100, as in macro processor 200.

The 300 MHz PowerPC CPU core in presently available Xilinx Virtex-II Pro is capable of self-contained operation using its cache and/or FPGA BlockRAMs for memory. Alternately a small 32-bit soft IP CPU core, for example the 100 MIPS Xilinx Microblaze, programmed into the FPGA fabric, may be used. Separate data memory 432 and instruction memory 414 are shown but they could also be a common memory. These memories may be small enough for on-chip BlockRAM implementation or may be off-chip SRAMs or DRAMs.

Figure 6:
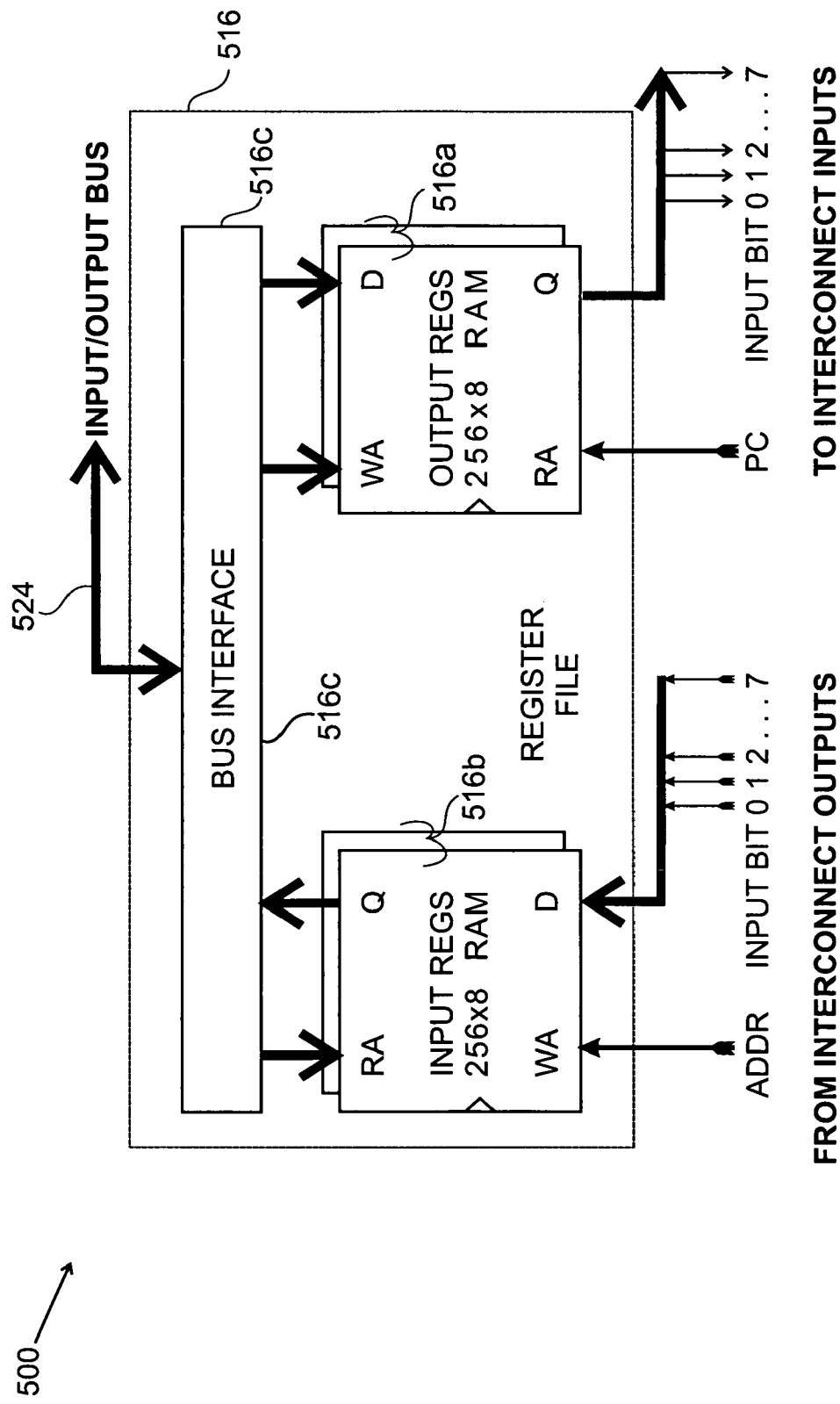
FIG. 6 is a logic diagram of an interface unit that can be used in the apparatus disclosed herein.

Turning to FIG. 6, an interface unit 500 will now be disclosed. The DUV has inputs and outputs which the accelerator receives from and sends to a host computer (not shown). Typically these inputs and outputs are interfaced with software running on the host computer, such as a testbench program, a software-based simulator, or a vector stimulus and collection system. The interface unit 500 facilitates communication between the apparatus disclosed herein and the host. Interface unit 500 has a register file 516 for the data being transferred between the host computer and the accelerator disclosed herein. Register file 516 is comprised of an output registers 516*a*, input registers 516*b* and a bus interface 516*c*. Output register file 516*a* and input register file 516*b* preferably comprise one or more dual-ported RAMs as in macro processor register files 216. The outputs of the interconnect 100 supply an address input and data to the input register 516*b*. Likewise, the output register 516*a*, which is driven by the program counter PC 12, supplies data to the interconnect 100. In both cases, the data is broken into multiple one-bit data connections for connection to interconnect 100, as in macro processor 200.

Output register file 516*a* and input register file 516*b* are preferably double-buffered. By double buffering the data stored in the output register files 516*a* and input register files 516*b*, the stored data is available to the interconnect 100 over the connections for interconnect inputs and outputs and also available to the host workstation over the input/output bus 524. Input/output bus 524 is in communication with the output registers 516*a* and input registers 516*b* through bus interface 516*c*. Thus, data from the host passes through the input/output bus 524, through bus interface 516*c*, and into the output registers 516*a* to the DUV. Likewise, data from the DUV passes from the interconnect 100, into the input registers 516*b*, through the bus interface 516*c*, and to the input/output bus 524 to the host.

A dedicated control unit (not shown) interfaces the instruction memories and processor controls of the apparatus disclosed herein to a host workstation. The host can write processor instruction memories 14, 114, 214, 314, set program counter PC 12 starting and ending addresses, start processors and stop processors, etc. It also enables the host computer to program the FPGAs before operation with the precompiled FPGA program bitstreams for the particular instance of acceleration system that is chosen to run the DUV.

When many processors are implemented on a single reconfigurable chip, choosing the right proportion between gate-level processors and macro processors to build into the chip may be difficult. Since logic designs vary in their gate-level/macro-level proportions, a chip with a fixed proportion of processors will often leave some logic or macro processors unused. In certain embodiments disclosed herein, the multiprocessor accelerator is implemented with one or more field-reconfigurable chips such as FPGAs. Many different implementations of the multiprocessor, each with a different proportion of logic processors and macro processors, are designed and precompiled for the field-reconfigurable chips. The implementation best suited for the gate-level/macro proportions of the particular design to be accelerated or emulated is selected and programmed into the field-reconfigurable chip.

For example, a preferred embodiment uses the Xilinx Virtex-II XC2V6000 FPGAs. This chip has 144 BlockRAMs available, which are used as instruction memories 14, 114, 214, 314, in the two hundred fifty six (256) word by seventy (72) bit configuration discussed above, addressed by a common program counter PC 12. Preferred embodiments discussed above use fifty-two bits in a logic processor instruction memory 14, thirty-three bits in a macro processor instruction memory 214, and sixty-one bits in a memory processor instruction memory 314. The number of bits used in the interconnect instruction memory 114 depends on how many processors are being interconnected. BlockRAMs are also used as data memory 318*a* in memory processors 300.

Consider two cases of designs to be accelerated as examples. The first case is a design with few macro operations and little memory, such as an encryption/decryption processor, which is dominated by logic operations. This first design's size is 200K equivalent gates and 100K bits of memory. A single XC2V6000 FPGA programmed with a first form of accelerator, which has one hundred twenty logic processors 10, one memory processor 300, and an interconnect 100, can handle over 200K gates of logic and 130K bits of memory, so it will accelerate this first case design.

The second case is a design such as a media processor, with thirty two bit multiplication macro operations for signal processing and 500K bits of memory for data buffers, and 100K equivalent gates of logic. This second design's size is 320K equivalent gates and 500K bits of memory, which will not fit in the first form of accelerator. The same XC2V6000 FPGA can be programmed with a second form of accelerator, which has seventy two (72) logic processors 10, four macro processors 200, four memory processors 300, and an interconnect 100. Fewer BlockRAMs and other resources are used for logic, by lowering the number of logic processors 10 from 120 in the first form to 72 in the second form, which makes room for more macro processors 200 and memory processors 300. This second form can handle 130K gates of logic, 1000 eight-bit macro operations, including eight-bit multiplication, and 500K bits of memory. Macro processor can execute a single eight bit by eight (8×8) bit multiplication with sixteen bit result as two macro operation instructions, one for each eight bits of the result. Each thirty (32) bit multiplier in the second design can be executed as thirty two (32) of these macro operation instructions.

Even though one form of accelerator cannot handle both designs, by choosing the one of these two forms of accelerator that suits the design, and loading the FPGA with programming for the appropriate format run time, either design can be handled by the same accelerator hardware.

Aspects of the compiler used for the apparatus will now be discussed. In general, the compiler takes the DUV in the form provided by user, and converts the design into a form that will be executable on the apparatus. The compiler targets a library of precompiled forms of accelerator FPGAs. As illustrated above, many different forms of the accelerator, which have different numbers of each type of processor, are designed and precompiled into a library of FPGA programming files.

A presently preferred compiler operates as follows. First the design that the user wishes to verify (i.e., the DUV) is compiled into a netlist with a single major clock cycle. This is similar to the compilation done for a DUV when using the Palladium™ design verification system from Cadence Design Systems, Inc., San Jose, Calif., United States of America. In particular, macro-level operations that can be executed on macro processors are preserved in the netlist, not reduced to Boolean logic form. For example if the RTL design has an add operation between twenty three (23) bit quantities, a single primitive for a twenty three (23)-bit adder appears in the netlist. Likewise operations and modules that are meant to be executed in the memory or general-purpose processors are preserved in the netlist. The compiler translates this input netlist into processor and interconnect instructions using following method:

First, the netlist of Boolean logic functions, macro functions, registers, and memories is mapped into the operations that are directly executed by the accelerator's processors. For example, a thirty two bit by thirty two (32×32) bit multiplication is broken up into a series of eight bit by eight (8×8) bit macro operations, since macro processor 200 can execute them in a single instruction. Also, Boolean logic equations are mapped into four (4) input lookup table operations, using technology mapping techniques well known in the prior accelerator art. A primitive netlist results from this mapping.

Next, the operations in the primitive netlist are partitioned across the available types of processors, and across groups of processors that will run in different FPGA chips (in multi-chip cases). Partitioning is done to suit the capacity of each processor and to minimize the nets that pass between processors and between chips, since their data must pass through one or more interconnect structures. To determine the capacity of each processor in each FPGA, the partitioner consults the library of available forms of accelerator FPGAs, to choose the form for each FPGA that has the best mix of processor types to suit the operations in the primitive netlist.

Then, each processor's operations are ordered according to their connectivity, as is done in prior-art processor-based accelerators, and translated into instructions.

Next, interconnect operations are scheduled to satisfy inter-processor communications. Null operation instructions are inserted into each processor's code as needed. The end result of this step is programs for each instruction memory 14, 114, 214, 314, 414 for each processor, as well as a list of the precompiled FPGA programming files to be used to program the FPGAs at run time. This completes compilation.

At run time each FPGA in the accelerator hardware is programmed with the precompiled programming files according to the list generated by compilation. Once each FPGA is programmed to implement the various processors, the programs for each instruction memory 14, 114, 214, 314, 414 for each processor are loaded into the processors. Then accelerated simulation proceeds, with the host sending input stimulus and collecting output response to/from the accelerated DUV. The host computer through interface unit 500 manages all these run time programming and control operations.

Figure 7:
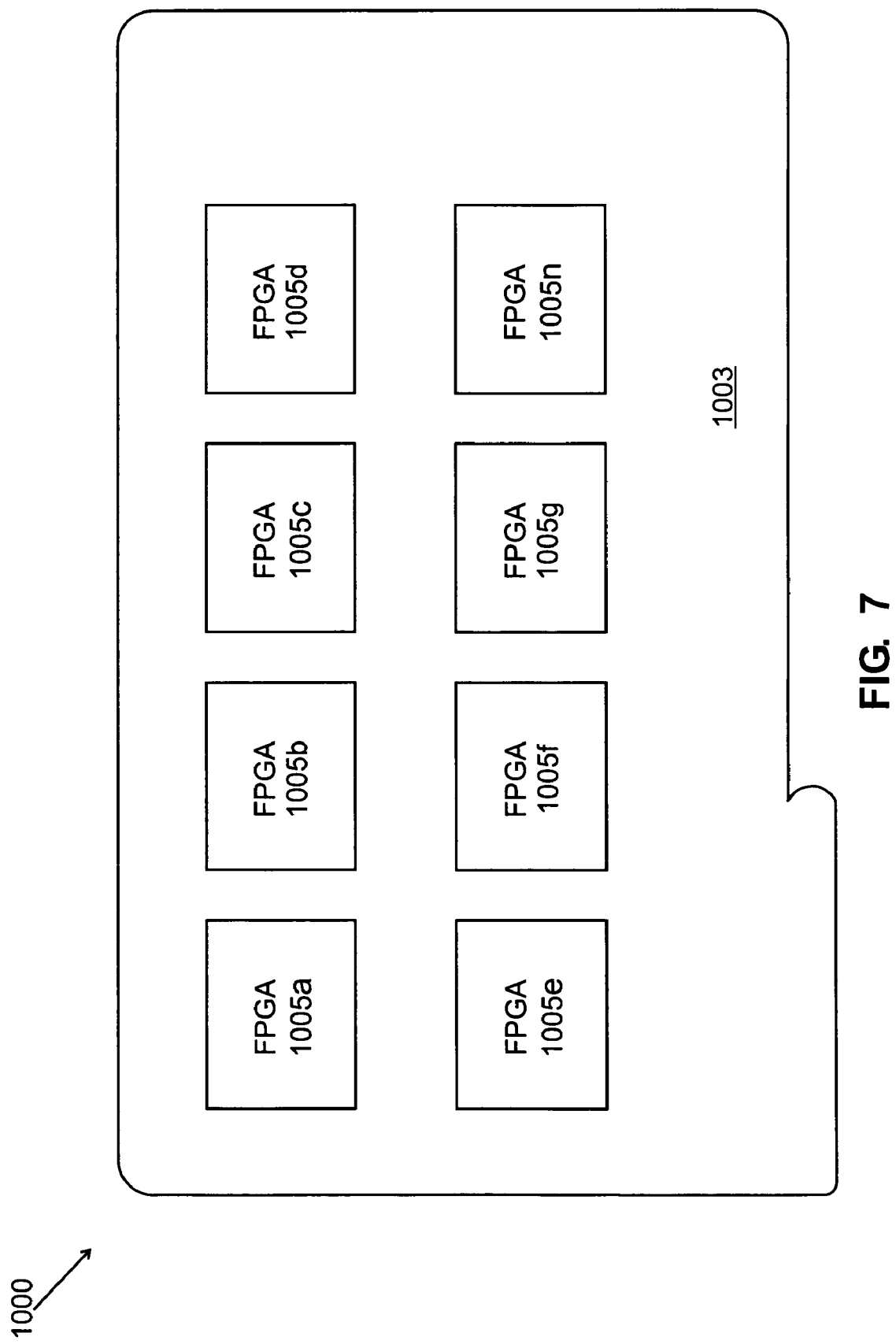
FIG. 7 is a block diagram showing how the FPGAs used to construct the apparatus can be interconnected together.

The apparatus disclosed herein can be implemented with one or more FPGAs and could be built on plug-in PCI cards, or on one or more larger motherboards. PC-type chassis, power and cooling may be used, with fans on the FPGAs if necessary. For example, FIG. 7 shows an exemplary system utilizing the teachings herein. The apparatus 1000 comprises a circuit board 1003 and at least one FPGA 1005*a*. Multiple FPGAs 1005*a*-1005*n* are shown in FIG. 7. FPGAs 1005*a*-1005*n* can be interconnected using various methods. For example, FPGAs 1005*a*-1005*n* can be interconnected such that the FPGAs are only interconnected to those FPGAs that are adjacent one another. This is often referred to as a nearest neighbor architecture. Alternatively, the FPGAs 1005a-1005n can be interconnected to one another through a bus. Yet another interconnect architecture would be through the use of interconnect chips (not shown). Such interconnect chips can be used in a hierarchical manner if desired. In addition, the crossbar architectures can be used. Interconnects 100 in each FPGA are organized and programmed accordingly.

A small system using only a single FPGA could be used as a component, such as on a platform development board, just as FPGAs are used today for prototyping design blocks connected to the platform's bus. While a hardware design would run slower in a system like that disclosed herein than in FPGA prototype form, it may be compiled and revised much faster and would offer full visibility, like software simulation.

The various embodiments disclosed herein are a multi-processor computer architecture for Boolean logic, well suited for FPGA implementation as a Low Cost hardware accelerator. Preferably, netlists generated by existing acceleration system compilers can also be compiled into programs that can be run on the multiprocessor computer disclosed herein. A variety of processor-based engines may be built with the architecture disclosed herein, and may be combined with FPGA CPU cores for very tight coupling with behavioral HDL and C code.

Thus, various inventive concepts have been described with reference to specific embodiments. It will, however, be evident that various modifications and changes may be made thereto without departing from the broader spirit and scope of the inventive concepts disclosed herein. For example, the reader is to understand that the specific ordering and combination of process actions described herein is merely illustrative, and the inventive concepts can be performed using different or additional process actions, or a different combination or ordering of process actions. The specification and drawings are, accordingly, to be regarded in an illustrative rather than restrictive sense, and the inventive concepts are not to be restricted or limited except in accordance with the following claims and their legal equivalents.

I claim:

1. A method for implementing a design verification system into at least one programmable logic device so that a user design to be verified can be implemented therein, comprising:
   mapping the user design into operations for execution;
   partitioning each of said operations into processor types suitable for each of said operations, wherein the processor types comprise logic processors, macro processors, memory processors and general purpose processors;
   ordering each of said processor types according to connectivity of each of said processor types;
   scheduling communications between each of said processor types; and
   programming said at least one programmable logic device to implement said processor types;
   wherein said logic processors comprise:
   an instruction memory;
   a logic functional unit that executes Boolean logic instructions; and
   a register file controlled by said instruction memory, said register file having outputs selectively in communication with said logic functional unit, said register file comprised of input registers and local registers, said local registers in communication with output from said logic functional unit.

2. The method of claim 1 wherein said partitioning step comprises:
   consulting a programmable logic device library that has a preprogrammed mix of said processor types; and
   selecting an appropriate preprogrammed mix of said processor types for said operations for execution.

3. The method of claim 1 wherein said scheduling step comprises:
   creating a program for instruction memories within each of said processor types; and
   creating programming files for each programmable logic device used for verifying the user design.

4. The method of claim 1 further comprising loading said program into each of said instruction memories.

5. A method for implementing a design verification system into at least one programmable logic device so that a user design to be verified can be implemented therein, comprising:
   mapping the user design into operations for execution;
   partitioning each of said operations into processor types suitable for each of said operations, wherein the processor types comprise logic processors, macro processors, memory processors and general purpose processors;
   ordering each of said processor types according to connectivity of each of said processor types;
   scheduling communications between each of said processor types; and
   programming said at least one programmable logic device to implement said processor types;
   wherein said macro processors comprise:
   an instruction memory;
   a macro processor executes macro instructions; and
   a register file controlled by said instruction memory, said register file having outputs selectively in communication said macro functional unit, said register file comprised of input registers and local registers, said local registers in communication with output from said macro functional unit.

6. A method for verifying functionality of an electronic design, the electronic design including Boolean logic gates, at least one macro function and at least one memory circuit, comprising;
   compiling the electronic design into logic processors that execute the Boolean logic gates, at least one macro processor that executes the at least one macro function, at least one memory processor that executes the at least one memory circuit, and an interconnect architecture that interconnects said logic processors, said at least one macro processor and said at least one memory processor to one another;
   programming said at least one programmable logic device to implement said logic processors, said at least one macro processor and said at least one memory processor;
   applying stimulus to said logic processors, said at least one macro processor and said at least one memory processor such that said logic processors execute the Boolean logic gates, said at least one macro processor executes the at least one macro function and said at least one memory processor executes the at least one memory circuit; and collecting output responses generated by said logic processors, said at least one macro processor programmed and said at least one memory processor;

wherein said interconnect architecture further comprises:

an instruction memory;

a plurality of buffers, wherein the number of said plurality buffers is equal to a sum of the number of said logic processors added to a number of said at least one macro processor added to a number of at least one said memory processor, each of said plurality of buffers having an output that is selected by said instruction memory;

a plurality of selectors, wherein the number of said plurality of selectors is equal to the number of said plurality of buffers, each of said plurality of selectors in communication with each of said plurality of buffers so that data stored in any of said plurality of buffers can be transmitted to any of said plurality of selectors, each of said plurality of selectors controlled by said instruction memory; and a plurality of output ports, each of said plurality of output ports corresponding to one of said plurality of selectors.

7. A method for verifying functionality of an electronic design, the electronic design including Boolean logic gates, at least one macro function and at least one memory circuit, comprising:

compiling the electronic design into logic processors that execute the Boolean logic gates, at least one macro processor that executes the at least one macro function, at least one memory processor that executes the at least one memory circuit, and an interconnect architecture that interconnects said logic processors, said at least one macro processor and said at least one memory processor to one another;

programming said at least one programmable logic device to implement said logic processors, said at least one macro processor and said at least one memory processor;

applying stimulus to said logic processors, said at least one macro processor and said at least one memory processor such that said logic processors execute the Boolean logic gates, said at least one macro processor executes the at least one macro function and said at least one memory processor executes the at least one memory circuit; and collecting output responses generated by said logic processors, said at least one macro processor programmed and said at least one memory processor;

wherein said logic processors comprise:

an instruction memory;

a register file controlled by said instruction memory, said register file having outputs selectively in communication said logic functional unit, said register file comprised of input registers and local registers, said input registers in communication with said interconnect architecture, said local registers in communication with output from said logic functional unit.

8. A method for verifying functionality of an electronic design, the electronic design including Boolean logic gates, at least one macro function and at least one memory circuit, comprising:

compiling the electronic design into logic processors that execute the Boolean logic gates, at least one macro processor that executes the at least one macro function, at least one memory processor that executes the at least one memory circuit, and an interconnect architecture that interconnects said logic processors, said at least one macro processor and said at least one memory processor to one another;

programming said at least one programmable logic device to implement said logic processors, said at least one macro processor and said at least one memory processor;

applying stimulus to said logic processors, said at least one macro processor and said at least one memory processor such that said logic processors execute the Boolean logic gates, said at least one macro processor executes the at least one macro function and said at least one memory processor executes the at least one memory circuit; and collecting output responses generated by said logic processors, said at least one macro processor programmed and said at least one memory processor programmed into said at least one programmable logic device;

wherein said at least one macro processor comprises:

an instruction memory; and a register file controlled by said instruction memory, said register file having outputs selectively in communication said macro functional unit, said register file comprised of input registers and local registers, said input registers in communication with said interconnect architecture, said local registers in communication with output from said macro functional unit.

* * * * *